(12) United States Patent
Jeon et al.

(10) Patent No.: US 11,251,022 B2
(45) Date of Patent: Feb. 15, 2022

(54) GAS SUPPLY ASSEMBLY AND SUBSTRATE PROCESSING APPARATUS INCLUDING THE SAME

(71) Applicant: Samsung Electronics Co., Ltd., Suwon-si (KR)

(72) Inventors: Kangmin Jeon, Hwaseong-si (KR); Dougyong Sung, Seoul (KR); Jongwoo Sun, Hwaseong-si (KR); Minkyu Sung, Hwaseong-si (KR); Kimoon Jung, Seoul (KR); Seongha Jeong, Hwaseong-si (KR); Ungyo Jung, Hwaseong-si (KR); Jewoo Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/871,427

(22) Filed: May 11, 2020

(65) Prior Publication Data

US 2021/0104381 A1 Apr. 8, 2021

(30) Foreign Application Priority Data

Oct. 7, 2019 (KR) .......................... 10-2019-0123958

(51) Int. Cl.
  *C23C 16/455* (2006.01)
  *H01J 37/32* (2006.01)
  *H01L 21/311* (2006.01)
  *H01L 21/67* (2006.01)

(52) U.S. Cl.
  CPC .... *H01J 37/3244* (2013.01); *H01J 37/32715* (2013.01); *H01L 21/31116* (2013.01); *H01L 21/67069* (2013.01); *H01J 2237/334* (2013.01)

(58) Field of Classification Search
  CPC ............ H01J 37/32715; H01J 37/3244; H01J 2237/334; H01L 21/67069; H01L 21/31116
  See application file for complete search history.

(56) References Cited

U.S. PATENT DOCUMENTS

| 6,432,259 B1 * | 8/2002 | Noorbakhsh ......... H01J 37/321 118/723 E |
| 7,879,182 B2 | 2/2011 | Ohmi et al. |
| 8,926,790 B2 | 1/2015 | Tetsuka et al. |
| 9,117,635 B2 | 8/2015 | Satoh et al. |

(Continued)

FOREIGN PATENT DOCUMENTS

| JP | 4628900 B2 | 2/2011 |
| KR | 101590897 B1 | 2/2016 |

*Primary Examiner* — Yuechuan Yu
(74) *Attorney, Agent, or Firm* — Harness, Dickey & Pierce, P.L.C.

(57) ABSTRACT

A gas supply assembly for a substrate processing apparatus includes a gas introduction part, a gas distribution plate connected to the gas introduction part, the gas distribution plate including a plurality of through holes, and a shower head disposed under the gas distribution plate, the shower head including a plurality of distribution holes in fluid communication with the plurality of through holes. One through hole is in fluid communication with at least two distribution holes, and each of the plurality of distribution holes has a first diameter and a second diameter differing from each other in the shower head.

17 Claims, 11 Drawing Sheets

(56) References Cited

U.S. PATENT DOCUMENTS

| | | |
|---|---|---|
| 9,136,097 B2 | 9/2015 | Koshimizu et al. |
| 10,087,524 B2 | 10/2018 | Tiner et al. |
| 2005/0178748 A1* | 8/2005 | Buchberger, Jr. ............ H01J 37/32183 219/121.48 |
| 2009/0179085 A1* | 7/2009 | Carducci ............. C23C 16/4557 239/289 |
| 2010/0230387 A1 | 9/2010 | Okesaku et al. |
| 2011/0024044 A1* | 2/2011 | Nagakubo ........... H01J 37/3244 156/345.33 |
| 2011/0198034 A1 | 8/2011 | Sun et al. |
| 2013/0200170 A1 | 8/2013 | Marx et al. |
| 2017/0178863 A1 | 6/2017 | Lubomirsky et al. |
| 2019/0145002 A1 | 5/2019 | Um et al. |

* cited by examiner

… (1)

GAS SUPPLY ASSEMBLY AND SUBSTRATE PROCESSING APPARATUS INCLUDING THE SAME

CROSS-REFERENCE TO RELATED APPLICATION

This application claims the benefit of Korean Patent Application No. 10-2019-0123958, filed on Oct. 7, 2019, in the Korean Intellectual Property Office, the disclosure of which is incorporated herein in its entirety by reference.

BACKGROUND

The inventive concepts relate to a gas supply assembly and/or a substrate processing apparatus including the same, and more particularly, to a gas supply assembly including a shower head and a gas distribution plate and/or a substrate processing apparatus including the gas supply assembly.

A process of manufacturing a semiconductor device uses an etch process of etching an etch target film on a semiconductor substrate to have a certain pattern. Such an etch process includes a dry etch process and a wet etch process, and a plasma etch process is a kind of dry etch process. The plasma etch process is characterized in that plasma is generated by distributing a process gas to the inside of a process chamber through a shower head of a substrate processing apparatus and etches the etch target film on the semiconductor substrate. However, the plasma etches the shower head as well as the etch target film on the semiconductor substrate, and thus, the shower head of the substrate processing apparatus is replaced at certain periods.

SUMMARY

The inventive concepts provide a gas supply assembly and/or a substrate processing apparatus including the same, in which designs of a shower head and a gas distribution plate each included in the gas supply assembly are changed, a replacement period of the shower head increases, and a discharging risk of the gas distribution plate is reduced.

In one embodiment, the gas supply assembly includes a gas introduction part, a gas distribution plate connected to the gas introduction part, the gas distribution plate including a plurality of through holes, and a shower head disposed under the gas distribution plate, the shower head including a plurality of distribution holes in fluid communication with the plurality of through holes, wherein one through hole is in fluid communication with at least two distribution holes, and each of the plurality of distribution holes has a first diameter and a second diameter differing from each other in the shower head.

In one embodiment, the gas supply assembly includes a gas introduction part, a gas distribution plate connected to the gas introduction part, the gas distribution plate including a metal material and a plurality of through holes, and a shower head disposed under the gas distribution plate, the shower head including a ceramic material and a plurality of distribution holes in fluid communication with the plurality of through holes, wherein one through hole is in fluid communication with three distribution holes, a virtual line connecting centers of the three distribution holes is a regular triangle, each of the plurality of distribution holes includes a refractive portion bent inside the shower head, and a diameter thereof varies with respect to the refractive portion.

In one embodiment, the substrate processing apparatus includes a process chamber, a gas supply configured to supply a process gas to the process chamber, a substrate support disposed in the process chamber to support a substrate, and a gas supply assembly disposed in the process chamber to distribute the process gas to an inner portion of the process chamber, wherein the gas supply assembly includes a gas introduction part connected to the gas supply, a gas distribution plate connected to the gas introduction part, the gas distribution plate including a plurality of through holes, and a shower head disposed under the gas distribution plate, the shower head including a plurality of distribution holes in fluid communication with the plurality of through holes, one through hole is in fluid communication with at least two distribution holes, and each of the plurality of distribution holes has a first diameter and a second diameter differing from each other in the shower head.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 1:
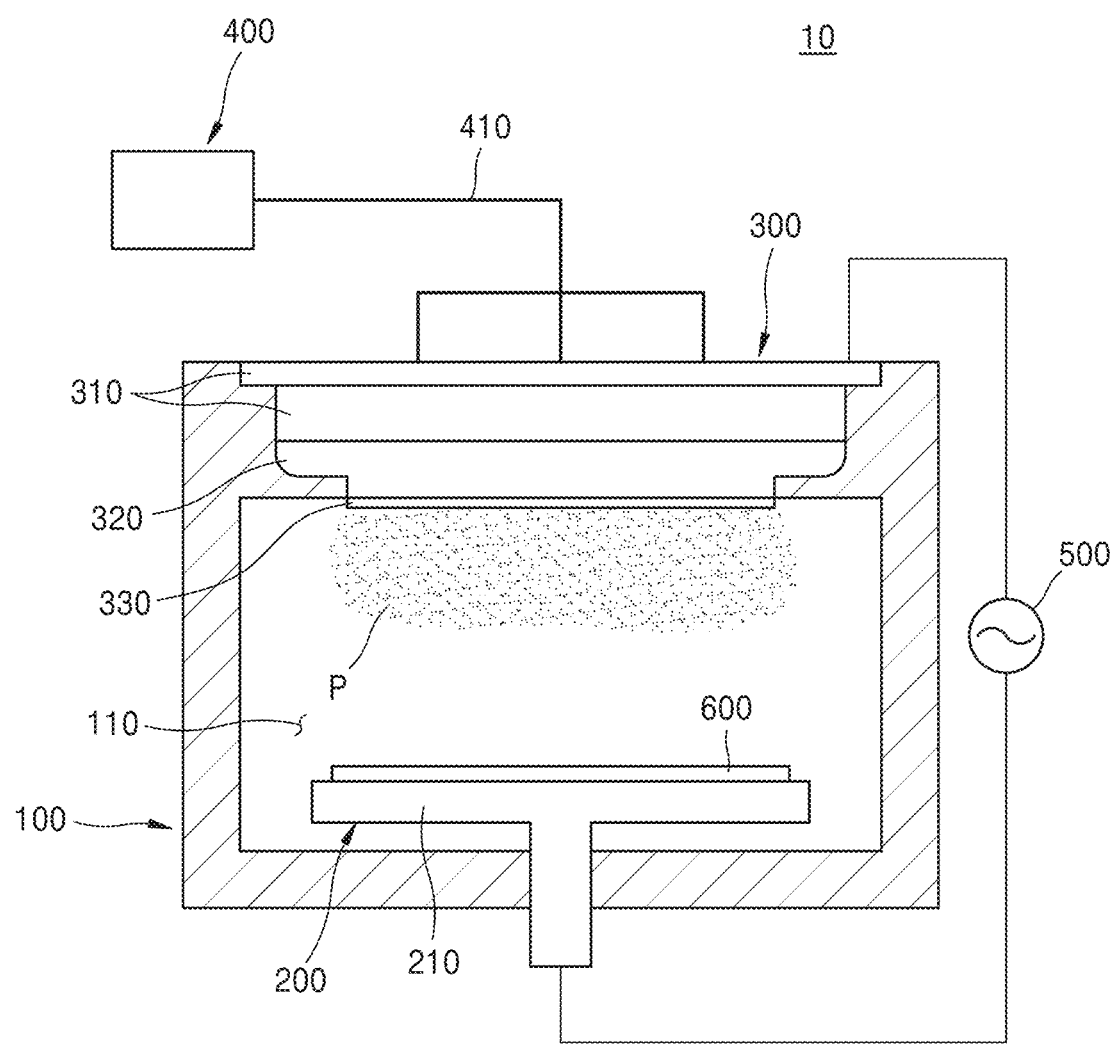
FIG. 1 is a schematic diagram illustrating a substrate processing apparatus according to an embodiment.

FIG. 1 is a schematic diagram illustrating a substrate processing apparatus 10 according to an embodiment.

Referring to FIG. 1, the substrate processing apparatus 10 may include a process chamber 100, a substrate support 200 disposed under the process chamber 100, and a gas supply assembly 300 disposed on the process chamber 100.

The process chamber 100 may include an internal space 110 having a certain size and may include a material, which is good in abrasion resistance and corrosion resistance. The process chamber 100 may be referred to as a chamber housing.

The process chamber 100 may include, for example, an aluminum block. The process chamber 100 may maintain the internal space 110 in a closed state or a vacuum state in a plasma processing process (for example, an etch process using plasma). The process chamber 100 may be a portion of the substrate processing apparatus 10 including a plurality of process chambers.

The substrate support 200 may be disposed at a lower portion of the internal space 110 of the process chamber 100. The substrate support 200 may include a supporter 210. A semiconductor substrate 600, which is to be processed, may be disposed on a top of the supporter 210.

The substrate support 200 may act as a substrate supporting member for supporting the semiconductor substrate 600. The substrate support 200 may fix and support the semiconductor substrate 600 while an etch process is being performed. The substrate support 200 may include a combination of aluminum and ceramic and may include a conductive portion for receiving an electrostatic force from an electrostatic force supply source (not shown) and a concave-convex protrusion portion having a polarity.

When the electrostatic force is applied to a portion between the semiconductor substrate 600 and the supporter 210 by using a bipolar electrostatic force supplied from the electrostatic force supply source, the semiconductor substrate 600 may be stably fixed to the supporter 210 while the etch process is being performed. The concave-convex protrusion portion may be disposed in the supporter 210 and may fix the semiconductor substrate 600 with the bipolar electrostatic force. However, the substrate support 200 is not limited thereto, and for example, the substrate support 200 may fix the semiconductor substrate 600 by using various manners such as mechanical clapping.

The gas supply assembly 300 may include a gas introduction part 310, a gas distribution plate 320, and a shower head 330. The gas supply assembly 300 may be disposed on the process chamber 100 at a position facing the substrate support 200 and may be apart from the process chamber 100 by a certain interval. The gas supply assembly 300 may be connected to the gas supply source 400 through a gas supply pipe 410, and the gas supply source 400 may supply a process gas to the internal space 110 through the gas supply assembly 300. The gas supply assembly 300 will be described below in detail.

The gas supply source 400 may be connected to the gas supply assembly 300 through the gas supply pipe 410. The gas supply pipe 410 may include a valve (not shown) which supplies the process gas from the gas supply source 400 to the gas supply assembly 300 and changes gas flow. The process gas may include, for example, a fluorine (F)-based gas, but is not limited thereto.

The gas supply source 400 may be controlled by a gas controller (not shown). That is, the gas controller may control the gas supply source 400 to control the kind, supply start/end time, and flow rate of a gas supplied to the gas supply assembly 300.

A power source 500 may be connected to the gas supply assembly 300 (where the gas supply assembly 300 may act as a top electrode) and the substrate support 200 (where the substrate support 200 may act as a bottom electrode), and by using power supplied from the power source 500, plasma P may be generated in the internal space 110 between the gas supply assembly 300 and the substrate support 200.

The power source 500, for example, may apply high-frequency power of about 60 MHz through the gas supply assembly 300 (where the gas supply assembly 300 may act as the top electrode) and may apply high-frequency power of about 2 MHz through the substrate support 200 (where the substrate support 200 may act as the bottom electrode).

A process of generating the plasma P will be briefly described below. When the process gas is supplied through the gas supply assembly 300 from the gas supply source 400 disposed outside the process chamber 100, power generated by the power source 500 may convert the process gas into the plasma P.

Therefore, the plasma P may be distributed to the semiconductor substrate 600 on the substrate support 200 disposed at a lower portion of the internal space 110. The plasma P may include an ion and/or radical (hereinafter referred to as an ion) of the process gas and may act as etch plasma P for etching an etch target film provided on the semiconductor substrate 600. The gas supply assembly 300 may allow the ion to be distributed at a uniform density in an upper space of the semiconductor substrate 600, and thus, may configure a plasma sheath having a uniform density on the semiconductor substrate 600. Therefore, a uniform etch process may be performed on a whole surface of the semiconductor substrate 600.

In addition to the elements, a temperature controller (not shown) for maintaining a constant temperature of each of the semiconductor substrate 600 and the internal space 110 of the process chamber 100 and an exhaust (not shown) for discharging a reactant byproduct or a residual process gas of the etch process may be further provided in the substrate processing apparatus 10 while a plasma etch process is being performed on the semiconductor substrate 600.

The semiconductor substrate 600, which is to be processed by the substrate processing apparatus 10, may include an active surface where a semiconductor device is provided and an inactive surface, which is opposite to the active surface. The active surface may correspond to a front-side surface of the semiconductor substrate 600, and the inactive surface may correspond to a back-side surface of the semiconductor substrate 600. Also, the semiconductor substrate 600 may include a wafer and a device forming material film provided on an active surface of the wafer.

In a process of manufacturing a semiconductor device, the semiconductor substrate 600 may perform an etch process of etching the etch target film on the semiconductor substrate 600 to have a certain pattern. Such an etch process may include a dry etch process and a wet etch process, and a plasma etch process using the plasma P may be a kind of dry etch process.

The etch process using the plasma P may be characterized in that the etch target film on the semiconductor substrate 600 is anisotropic-etched by using the plasma P, which is generated by distributing the process gas to the internal space 110 of the process chamber 100 through the gas supply assembly 300.

However, the plasma P may partially etch the shower head 330 as well as the etch target material film on the semiconductor substrate 600, and thus, the shower head 330 etched at a certain rate should be replaced at certain periods. Also, in the etch process using the plasma P, there may be a risk where undesired discharging caused by a bond of the process gas and an ion occurs in the gas supply assembly 300 (particularly, a connection portion at which the gas distribution plate 320 contacts the shower head 330).

In the substrate processing apparatus 10 according to an embodiment, designs of the shower head 330 and the gas distribution plate 320 each included in the gas supply assembly 300 may each be changed to a below-described shape, and thus, a replacement period of the shower head 330 may increase and a discharging risk may decrease in the gas distribution plate 320. Therefore, a productivity of the substrate processing apparatus 10 may increase.

Figure 2:
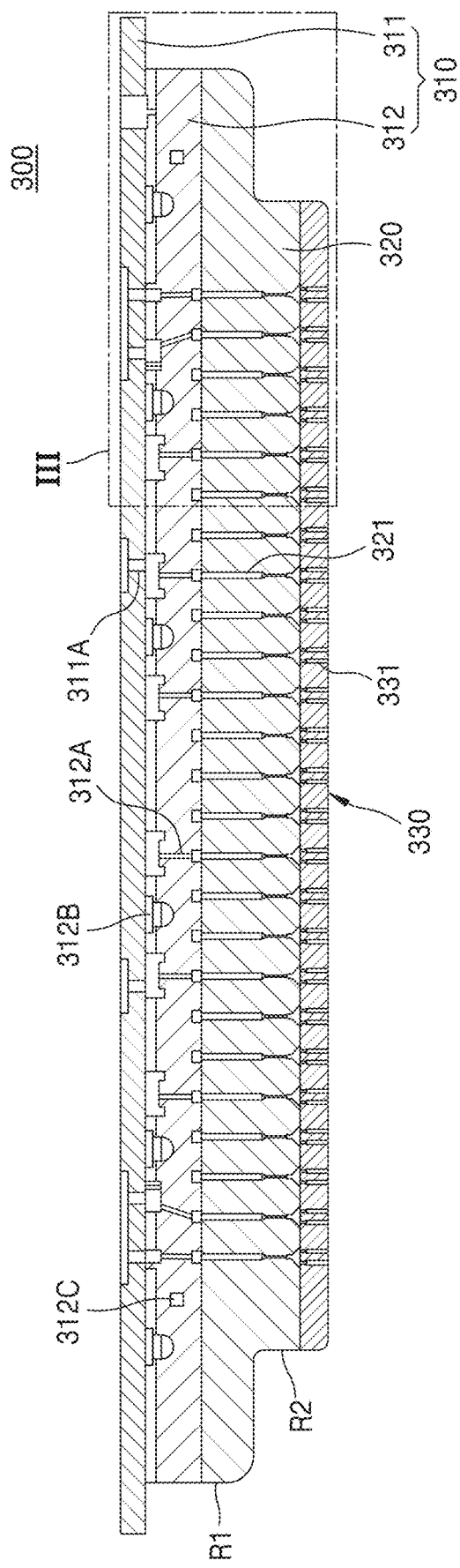
FIG. 2 is a side cross-sectional view illustrating a gas supply assembly for the substrate processing apparatus of FIG. 1.
Figure 3:
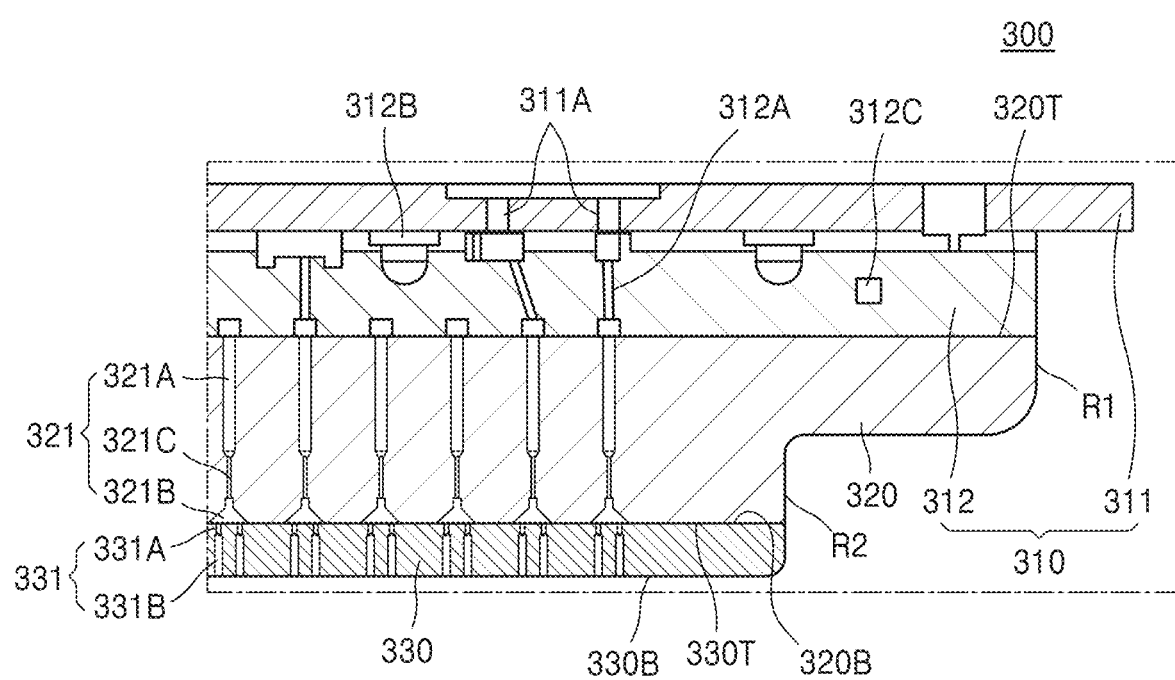
FIG. 3 is an enlarged view of a region III of FIG. 2.
Figure 4:
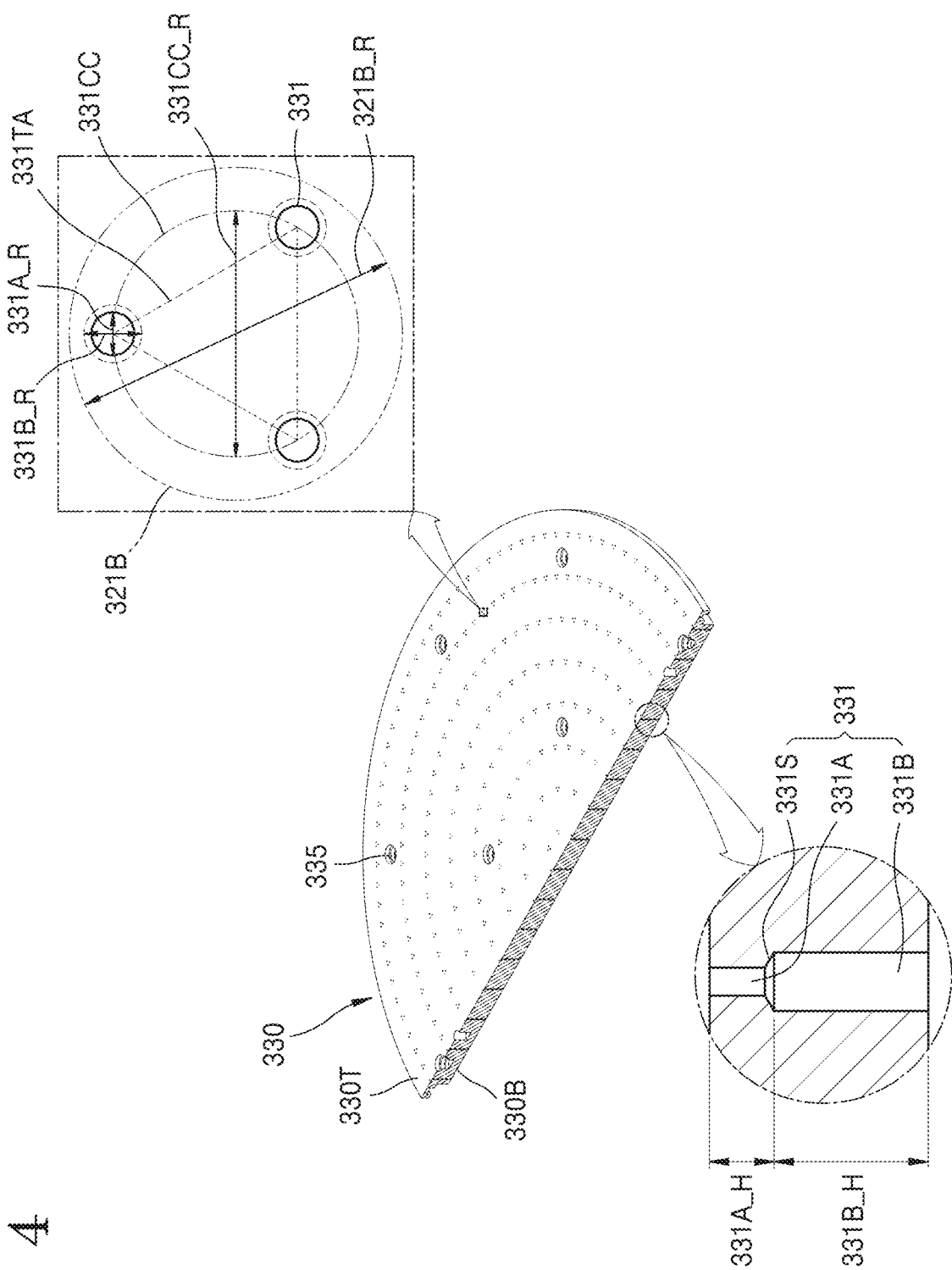
FIG. 4 is a diagram illustrating a feature of a shower head of FIG. 2.

FIG. 2 is a side cross-sectional view illustrating a gas supply assembly 300 for the substrate processing apparatus of FIG. 1, FIG. 3 is an enlarged view of a region III of FIG. 2, and FIG. 4 is a diagram illustrating a feature of a shower head of FIG. 2.

Referring to FIGS. 2 to 4, the gas supply assembly 300 may include a gas introduction part 310, a gas distribution plate 320, and a shower head 330.

The gas introduction part 310 may include a metal material including aluminum. However, a material of the gas introduction part 310 is not limited thereto and may use other solid materials.

The gas introduction part 310 may include a first body part 311 and a second body part 312. The gas introduction part 310 may have a structure where the second body part 312 and the first body part 311 are sequentially stacked on the gas distribution plate 320 and are connected to each other.

The first body part 311 may have, for example, a circular plate shape. The first body part 311 may include a plurality of first holes 311A, which extend from a top to a bottom thereof.

The second body part 312 may be disposed under the first body part 311. The second body part 312 may have, for example, a circular plate shape. In this case, the second body part 312 may have a diameter which is less than that of the first body part 311. Therefore, the second body part 312 may have a step height between the second body part 312 and the first body part 311 with contacting the first body part 311.

The second body part 312 may include a plurality of second holes 312A connected to the plurality of first holes 311A. The number of second holes 312A may be greater than the number of first holes 311A, and a diameter of each of the second holes 312A may be less than that of each of the first holes 311A.

The second body part 312 may include a cooling system 312B provided therein. The cooling system 312B may include, for example, a refrigerant path through which a refrigerant flows. The cooling system 312B may discharge heat, transferred from the gas distribution plate 320 and the shower head 330 described below, to the outside. Therefore, the shower head 330 may be mitigated or prevented from being excessively heated in an etch process.

Also, the second body 312 may include a heating system 312C provided therein. The heating system 312C may include, for example, a heating block. The heating system 312C may prevent a temperature of the gas supply assembly 300 including the shower head 330 from decreasing to less than or equal to a temperature for an operation of a substrate processing apparatus 10 (see FIG. 1) in an idle state.

The cooling system 312B and the heating system 312C may selectively operate depending on the case and may control a temperature of the gas supply assembly 300 including the shower head 330. In the present embodiment, the cooling system 312B and the heating system 312C are illustrated as being disposed in the second body part 312, but are not limited thereto. For example, the cooling system 312B and/or the heating system 312C may be disposed in the first body part 311.

The gas distribution plate 320 may include a plurality of through holes 321, which are disposed under the gas introduction part 310 and are in fluid communication with the plurality of second holes 312A.

The gas distribution plate 320 may include a first side surface R1, which is a coplanar surface along with a side surface of the second body part 312, and a second side surface R2, which is a coplanar surface along with a side surface of the shower head 330, and moreover, may have a step height between the first side surface R1 and the second side surface R2.

The gas supply assembly 300 may be fixed to an upper portion of a process chamber 100 (see of FIG. 1) through the step height of the gas distribution plate 320 and the step height between the second body part 312 and the first body part 311.

The gas introduction part 310 and the gas distribution plate 320 may be detachably coupled to each other by using, for example, a screw fastening manner using a fastening bolt. As described above, the gas supply assembly 300 may include the gas introduction part 310 and the gas distribution plate 320, which are detachable/attachable therebetween, and thus, even when a problem caused by thermal fatigue occurs in a certain region due to being exposed to high-temperature plasma P (see FIG. 1), the problem may be more easily solved by replacing only a corresponding portion. Therefore, maintenance may be easy, and it is not required to entirely replace the gas supply assembly 300, thereby reducing cost.

The shower head 330 may be disposed under the gas distribution plate 320. The shower head 330 may be directly exposed to the plasma P (see FIG. 1) generated in an internal space 110 (see FIG. 1) of the process chamber 100 (see FIG. 1).

The shower head 330 may be directly exposed to the high-temperature plasma P (see FIG. 1) among the elements of the gas supply assembly 300, and thus, may include a material for enduring a high temperature. A material of the shower head 330 may include, for example, a ceramic material such as silicon (Si) or silicon carbide (SiC). However, the material of the shower head 330 is not limited thereto and may be other materials having heat resistance.

The shower head 330 may include a plurality of distribution holes 331 connected to the plurality of through holes 321. Namely, the distribution holes 331 and the through holes 321 are in fluid communication. The shower head 330 may correspond to a consumption part requiring periodic replacement unlike the other elements of the gas supply assembly 300. Therefore, the shower head 330 may be easily replaced. The shower head 330 may be detachably fastened to, for example, the gas distribution plate 320 by a fastening bolt.

Although not shown, a buffer layer may be disposed between the gas distribution plate 320 and the shower head 330. The buffer layer may fill a gap occurring between the gas distribution plate 320 and the shower head 330 to increase a contact area therebetween. Because the contact area increases, a heat dissipation characteristic of the shower head 330 may be enhanced.

The gas distribution plate 320 will be described below in more detail.

The gas distribution plate 320 may include a plurality of through holes 321. The gas distribution plate 320 may include a top 320T connected to the gas introduction part 310 and a bottom 320B facing the shower head 330. Each of the plurality of through holes 321 may include an upper portion 321A connecting with the top 320T and a lower portion 321B connecting with the bottom 320B. Namely, the upper portion 321A is in fluid communication with the top 320T, and the lower portion 321B is in fluid communication with the bottom 320B. In some embodiments, each of the plurality of through holes 321 may further include a connection portion 321C connecting the upper portion 321A to the lower portion 321B. Namely, the connection portion 321C provides fluid communication between the upper portion 321A and the lower portion 321B. The plurality of through holes 321 may be provided to pass through the gas distribution plate 320 and may enable a process gas to easily move to the shower head 330.

In some embodiments, a region where the upper portion 321A contacts the connection portion 321C may be provided as a counter sunk so as to decrease a residual electrical field in each of the plurality of through holes 321 and to enable the process gas to more uniformly flow.

In some embodiments, in order for the process gas to uniformly flow in the plurality of through holes 321, the lower portion 321B may be provided in a funnel shape. That is, the lower portion 321B may have a shape where a diameter progressively increases in a direction from a region (i.e., an upper portion) contacting the connection portion 321C to a region (i.e., a lower portion) contacting the bottom 320B.

In some embodiments, a diameter of the connection portion 321C may be less than a diameter of the upper portion 321A and a diameter of the lower portion 321B. That is, the plurality of through holes 321 may be designed so that the upper portion 321A, the connection portion 321C, and the lower portion 321B have different diameters, and thus, a flow velocity of the process gas varies. However, the present embodiment is not limited thereto.

The shower head 330 will be described below in more detail.

The shower head 330 may include a plurality of distribution holes 331. Also, the shower head 330 may include a plurality of fastening holes 335, which are processed in a screw shape, in order for the shower head 330 to be fastened to the gas distribution plate 320.

The shower head 330 may include a first surface 330T connected to the gas distribution plate 320 and a second surface 330B opposite to the first surface 330T. Each of the plurality of distribution holes 331 may include a first portion 331A, which connects with the first surface 330T and has a first diameter 331A_R, and a second portion 331B, which connects with the second surface 330B and has a second diameter 331B_R. The plurality of distribution holes 331 may be provided to pass through the shower head 330 and may enable the process gas to easily move to the internal space 110 (see FIG. 1) of the process chamber 100 (see FIG. 1). Namely, the distribution holes 331 provide for fluid communication.

In some embodiments, the first diameter 331A_R of the first portion 331A may be less than the second diameter 331B_R of the second portion 331B. For example, the first diameter 331A_R of the first portion 331A may be about 0.5 mm or less. Also, the second diameter 331B_R of the second portion 331B may be about 0.7 mm to about 1.8 mm. That is, each of the plurality of distribution holes 331 may be designed so that the first portion 331A and the second portion 331B have different diameters, and thus, a flow velocity of the process gas varies. However, the present embodiment is not limited thereto.

In some embodiments, each of the plurality of distribution holes 331 may be vertical to the first surface 330T and the second surface 330B and may have a stepped portion 331S at a position at which the first portion 331A changes to the second portion 331B. The stepped portion 331S may be provided closer to the first surface 330T than the second surface 330B. In other words, a length 331A_H of the first portion 331A may be less than a length 331B_H of the second portion 331B.

In the gas supply assembly 300 according to an embodiment, one through hole 321 may be connected to or in fluid communication with at least two distribution holes 331. In some embodiments, one through hole 321 may be connected to or in fluid communication with three distribution holes 331. Here, a virtual line connecting centers of the three distribution holes 331 connected to the one through hole 321 may be a regular triangle 331TA. In other words, the three distribution holes 331 may be respectively disposed at vertexes of the regular triangle 331TA. Also, a diameter 331CC_R of a virtual circle 331CC connecting the centers of the three distribution holes 331 may be less than a maximum diameter 321B_R of a lower portion 321B of the one through hole 321. The virtual circle 331CC may be a circumcircle of the regular triangle 331TA.

The diameter 331CC_R of the virtual circle 331CC may be, for example, about 2.5 mm to about 3.5 mm. Also, the maximum diameter 321B_R of the lower portion 321B may be about 4 mm to about 5 mm. That is, three distribution holes 331 may be designed to all overlap one through hole 321. However, the present embodiment is not limited thereto.

As described above, the shower head 330 may correspond to a consumption part unlike the other elements of the gas supply assembly 300. In a substrate processing apparatus 10 (see FIG. 1), when a plasma etch process is performed a plurality of times, an undesired etch process may be performed on the plurality of distribution holes 331, and thus, a flow velocity of the process gas passing through the shower head 330 may vary. The variation of the flow velocity of the process gas may affect a precise etch process, and thus, when a certain-level variation of the flow velocity is sensed, the shower head 330 should be replaced.

In the following Table 1, cases for measuring a flow velocity of the process gas have been divided based on a difference between shapes of the plurality of distribution holes 331, and in each of the cases, experiments have been performed for measuring a flow velocity of the process gas in a state (before etching) of when the etch process is performed for the first time in a substrate processing apparatus and a flow velocity of the process gas in a state (after etching) of when the etch process is performed a plurality of times in the substrate processing apparatus. In cases 1 to 3, the experiments have been performed under a condition where variables other than the gas supply assembly 300 are the same.

TABLE 1

| State | Case 1 | | Case 2 | | Case 3 | |
|---|---|---|---|---|---|---|
| | Before etching | After etching | Before etching | After etching | Before etching | After etching |
| Flow velocity (m/s) | 289.7 | 168.4 | 178.4 | 115.3 | 135.0 | 104.6 |

The case 1 shows an experiment result obtained by measuring a flow velocity variation of the process gas by using a shower head where one through hole 321 is connected to or in fluid communication with one distribution hole 331 and which includes the distribution holes 331 each having the same diameter as that of the first portion 331A without the stepped portion 331S. A flow velocity before performing the etch process is 289.7 m/s, and a flow velocity after performing the etch process a certain number of times is 168.4 m/s. That is, it may be seen that a flow velocity variation of the process gas corresponds to about 42%.

The case 2 shows an experiment result obtained by measuring a flow velocity variation of the process gas by using a shower head where one through hole 321 is connected to or in fluid communication with three distribution holes 331 and which includes the distribution holes 331 each having the same diameter as that of the first portion 331A without the stepped portion 331S. A flow velocity before performing the etch process is 178.4 m/s, and a flow velocity after performing the etch process a certain number of times is 115.3 m/s. That is, it may be seen that a flow velocity variation of the process gas corresponds to about 35%.

The case 3 shows an experiment result obtained by measuring a flow velocity variation of the process gas by using the shower head 330 of the gas supply assembly 300 according to an embodiment, where one through hole 321 is connected to or in fluid communication with three distribution holes 331 and which includes the distribution holes 331 each including the first portion 331A and the second portion 331B and having the stepped portion 331S therebetween. A flow velocity before performing the etch process is 135.0 m/s, and a flow velocity after performing the etch process a certain number of times is 104.6 m/s. That is, it may be seen that a flow velocity variation of the process gas corresponds to about 23%.

As in the experiment result of Table 1, it may be seen that, in a case which uses the shower head 330 of the gas supply assembly 300 according to an embodiment, a flow velocity variation of the process gas is considerably small compared to the other cases.

Also, some ions of plasma P (see FIG. 1) may reversely flow with respect to a flow of the process gas and may penetrate into the gas distribution plate 320, along the plurality of distribution holes 331 of the shower head 330. In this case, the ions and the process gas each remaining in the plurality of through holes 321 of the gas distribution plate 320 may meet, and due to this, undesired discharging may occur between the gas distribution plate 320 and the shower head 330. It may be seen based on Paschen's law that the occurrence of the discharging is effectively reduced by lowering pressure of each of the through holes 321.

In the following Table 2, cases for measuring pressure of each of the through holes 321 have been divided based on a difference in number of distribution holes 331 connected to or in fluid communication with one through hole 321, and in each of the cases, experiments have been performed for measuring pressure of each of the through holes 321. In cases A and B, the experiments have been performed under a condition where variables other than the number of distribution holes 331 are the same.

TABLE 2

| | Case A | Case B |
|---|---|---|
| Pressure (torr) | 12.7 | 6.7 |

The case A shows an experiment result obtained by measuring pressure of each through hole 321 by using a shower head connected to or in fluid communication with one distribution hole 331. It may be seen that pressure of each through hole 321 corresponds to 12.7 torr.

The case B shows an experiment result obtained by measuring pressure of each through hole 321 by using the shower head 330 of the gas supply assembly 300 according to an embodiment, where one through hole 321 is connected to or in fluid communication with three distribution holes 331. It may be seen that pressure of each through hole 321 corresponds to 6.7 torr.

As in the experiment result of Table 2, it may be seen that, in a case which uses the shower head 330 of the gas supply assembly 300 according to an embodiment, pressure of each through hole 321 is considerably low.

As a result, in the substrate processing apparatus 10 (see FIG. 1) according to an embodiment, designs of the shower head 330 and the gas distribution plate 320 each included in the gas supply assembly 300 may each be changed to the above-described shape, and thus, a replacement period of the shower head 330 may increase and undesired discharging may be effectively reduced or prevented. Therefore, a productivity of the substrate processing apparatus 10 (see FIG. 1) may increase.

Figure 5:
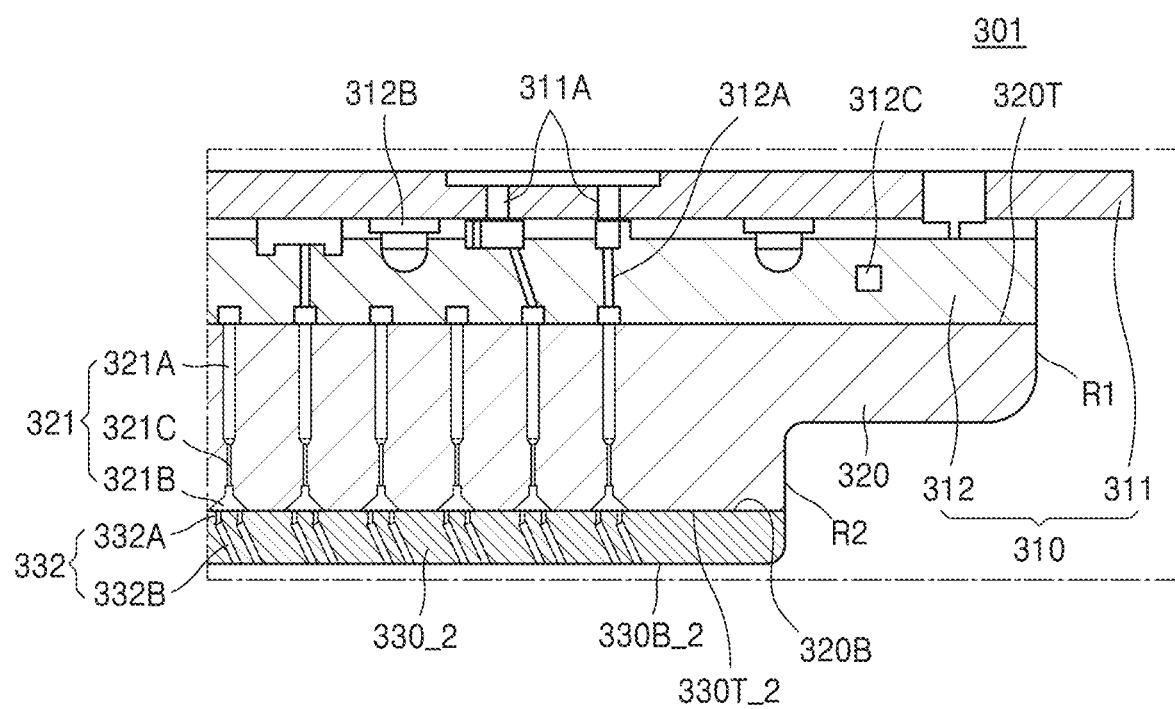
FIG. 5 is a side cross-sectional view illustrating a gas supply assembly for a substrate processing apparatus according to an embodiment.
Figure 6:
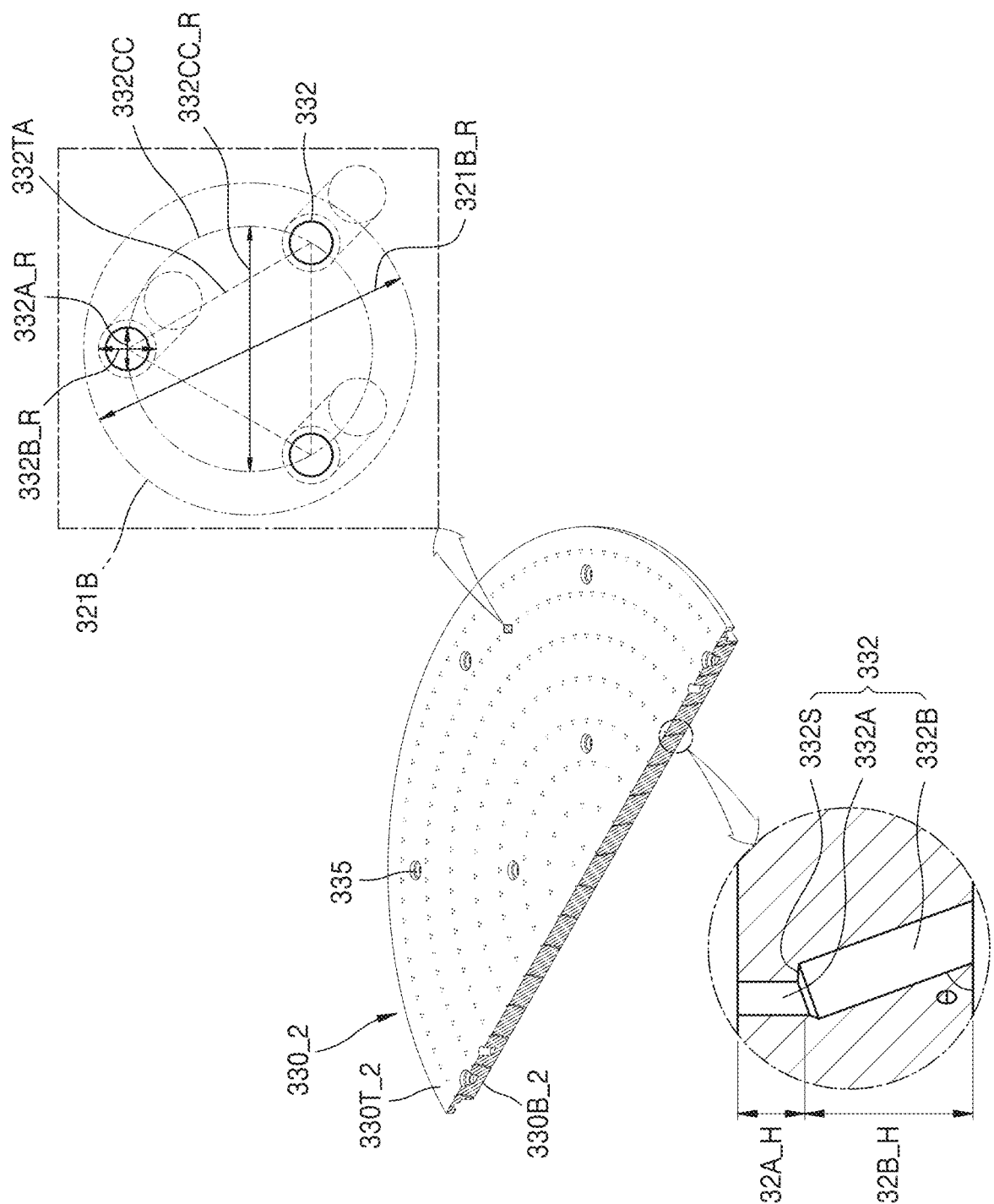
FIG. 6 is a diagram illustrating a feature of a shower head of FIG. 5.

FIG. 5 is a side cross-sectional view illustrating a gas supply assembly 301 for a substrate processing apparatus according to an embodiment, and FIG. 6 is a diagram illustrating a feature of a shower head of FIG. 5.

Elements of the gas supply assembly 301 for the substrate processing apparatus and features of the elements are substantially the same as or similar to the descriptions given above with reference to FIGS. 2 to 4. Therefore, for convenience of description, a difference with the gas supply assembly 300 for the substrate processing apparatus (see FIG. 2) described above will be mainly described below.

Referring to FIGS. 5 and 6, the gas supply assembly 301 for the substrate processing apparatus may include a gas introduction part 310, a gas distribution plate 320, and a shower head 330_2.

The shower head 330_2 may be disposed under the gas distribution plate 320. The shower head 330_2 may be directly exposed to plasma P (see FIG. 1) generated in an internal space 110 (see FIG. 1) of a process chamber 100 (see FIG. 1).

The shower head 330_2 may be a part directly exposed to the high-temperature plasma P (see FIG. 1) among the elements of the gas supply assembly 301, and thus, may include a material having heat resistance.

The shower head 330_2 may include a plurality of distribution holes 332 connected to or in fluid communication with the plurality of through holes 321. The shower head 330_2 may correspond to a consumption part unlike the other elements of the gas supply assembly 301. Therefore, the shower head 330_2 may be easily replaced. The shower head 330_2 may be detachably fastened to, for example, the gas distribution plate 320 by a fastening bolt.

The shower head 330_2 will be described below in more detail.

The shower head 330_2 may include a plurality of distribution holes 332. Also, the shower head 330_2 may include a plurality of fastening holes 335, which are processed in a screw shape, in order for the shower head 330_2 to be fastened to the gas distribution plate 320.

The shower head 330_2 may include a first surface 330T_2 connected to the gas distribution plate 320 and a second surface 330B_2 opposite to the first surface 330T_2. Each of the plurality of distribution holes 332 may include a first portion 332A, which connects or is in fluid communication with the first surface 330T_2 and has a first diameter 332A_R, and a second portion 332B, which connects or is in fluid communication with the second surface 330B_2 and has a second diameter 332B_R. The plurality of distribution holes 332 may be provided to pass through the shower head 330_2 and may enable the process gas to easily move to the internal space 110 (see FIG. 1) of the process chamber 100 (see FIG. 1).

In some embodiments, the first diameter 332A_R of the first portion 332A may be less than the second diameter 332B_R of the second portion 332B. For example, the first diameter 332A_R of the first portion 332A may be about 0.5 mm or less. Also, the second diameter 332B_R of the second portion 332B may be about 0.7 mm to about 1.8 mm. That is, each of the plurality of distribution holes 332 may be designed so that the first portion 332A and the second portion 332B have different diameters, and thus, a flow velocity of the process gas varies. However, the present embodiment is not limited thereto.

In some embodiments, the first portion 332A may be vertical to the first surface 330T_2, and each of the plurality of distribution holes 332 have a refractive portion 332S, which is bent at a certain angle at a position at which the first portion 332A changes to the second portion 332B. Also, an inclination angle "0" between the second portion 332B and the second surface 330B_2 may be an acute angle. The refractive portion 332S may be provided closer to the first surface 330T_2 than the second surface 330B_2. In other words, a length 332A_H of the first portion 332A may be less than a vertical-direction length 332B_H of the second portion 332B.

In the gas supply assembly 301 according to an embodiment, one through hole 321 may be connected to or in fluid communication with at least two distribution holes 332. In some embodiments, one through hole 321 may be connected to or in fluid communication with three distribution holes 332. Here, a virtual line connecting centers of the three distribution holes 332 connected to the one through hole 321 may be a regular triangle 332TA. In other words, the three distribution holes 332 may be respectively disposed at vertexes of the regular triangle 332TA. Also, a diameter 332CC_R of a virtual circle 332CC connecting the centers of the three distribution holes 332 may be less than a maximum diameter 321B_R of a lower portion 321B of the one through hole 321. The virtual circle 332CC may be a circumcircle of the regular triangle 332TA.

The diameter 332CC_R of the virtual circle 332CC may be, for example, about 2.5 mm to about 3.5 mm. Also, the maximum diameter 321B_R of the lower portion 321B may be about 4 mm to about 5 mm. That is, first portions 332A of three distribution holes 332 may be designed to all overlap one through hole 321. In some embodiments, at least some of second portions 332A of three distribution holes 332 may be designed not to overlap one through hole 321. However, the present embodiment is not limited thereto.

As described above, the shower head 330_2 may correspond to a consumption part unlike the other elements of the gas supply assembly 301. In a substrate processing apparatus 10 (see FIG. 1), when a plasma etch process is performed a plurality of times, an undesired etch process may be performed on the plurality of distribution holes 332, and thus, a flow velocity of the process gas passing through the shower head 330_2 may vary. The variation of the flow velocity of the process gas may affect a precise etch process, and thus, when a certain-level variation of the flow velocity is sensed, the shower head 330_2 may be replaced.

In the substrate processing apparatus 10 (see FIG. 1) according to an embodiment, designs of the shower head 330_2 and the gas distribution plate 320 each included in the gas supply assembly 301 may each be changed to the above-described shape, and thus, a replacement period of the shower head 330_2 may increase.

Also, some of the ions of the plasma P (see FIG. 1) may reversely flow with respect to a flow of the process gas and may penetrate into the gas distribution plate 320, along the plurality of distribution holes 332 of the shower head 330_2. In this case, the ions and the process gas each remaining in the plurality of through holes 321 of the gas distribution plate 320 may meet, and due to this, undesired discharging may occur between the gas distribution plate 320 and the shower head 330_2.

The substrate processing apparatus 10 (see FIG. 1) according to an embodiment may be designed so that the shower head 330_2 includes the plurality of distribution holes 332 bent at a certain angle in order for an ion having linearity not to penetrate into the gas distribution plate 320, thereby mitigating or preventing undesired discharging.

Therefore, a productivity of the substrate processing apparatus 10 (see FIG. 1) may increase.

Figure 7:
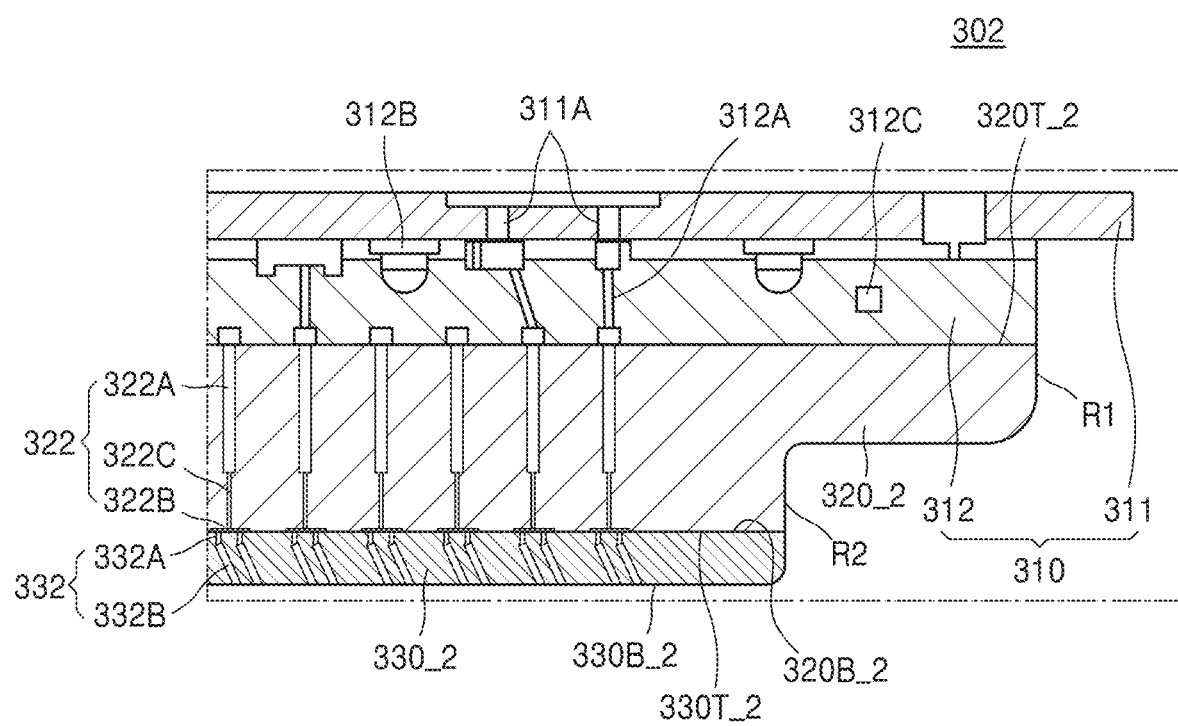
FIG. 7 is a side cross-sectional view illustrating a gas supply assembly for a substrate processing apparatus according to an embodiment.
Figure 8:
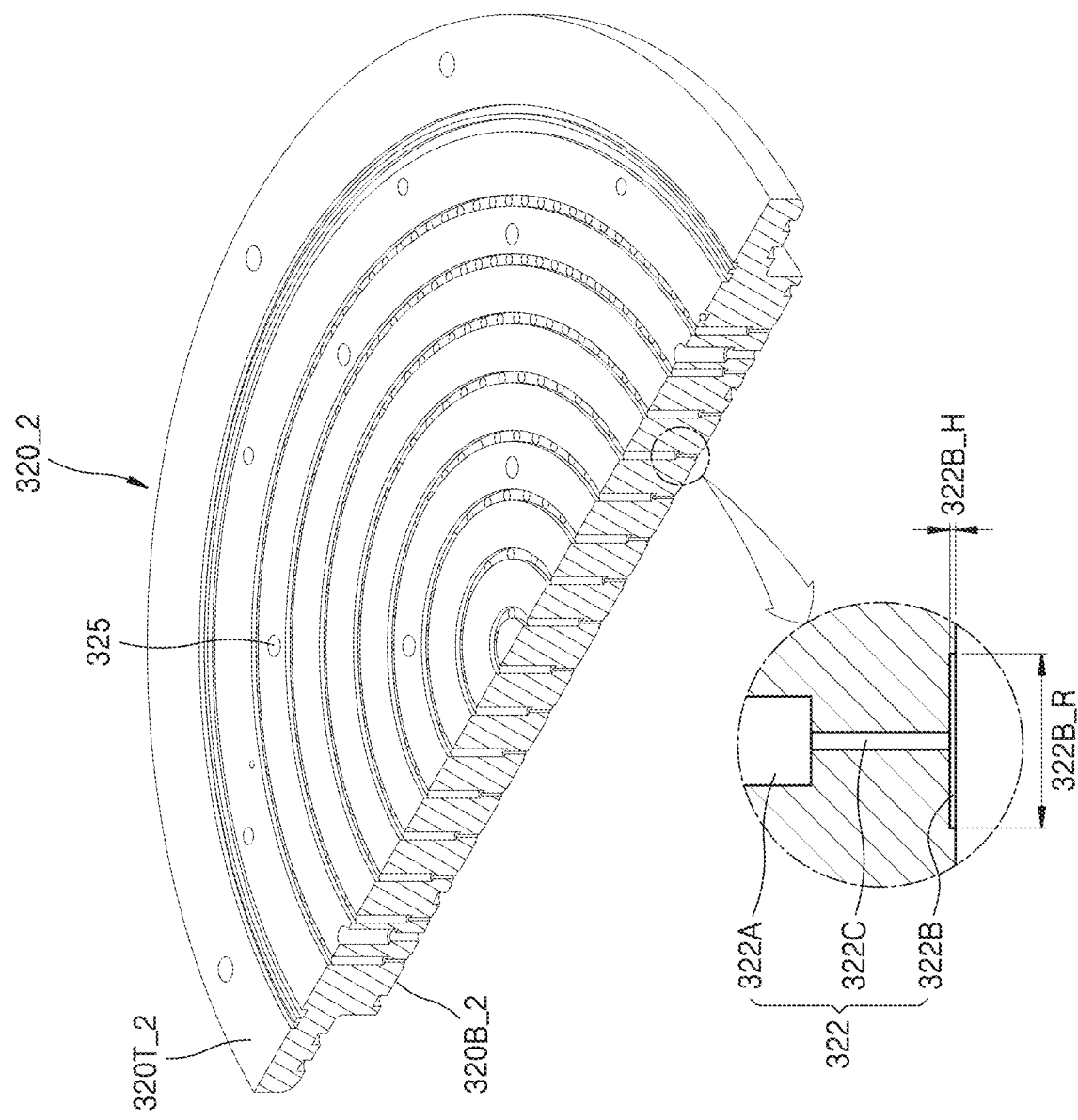
FIG. 8 is a diagram illustrating a feature of a gas distribution plate of FIG. 7.
Figure 9:
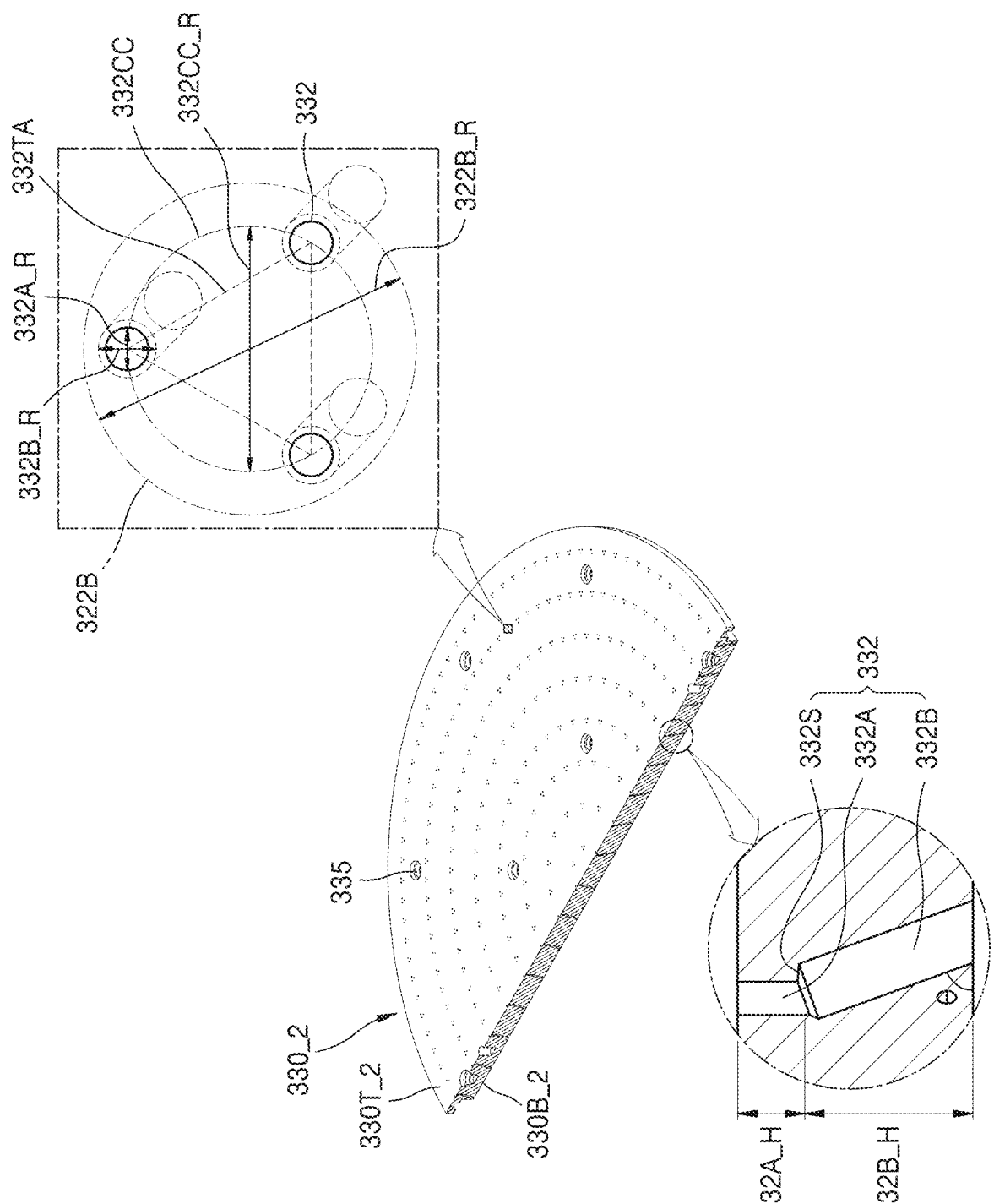
FIG. 9 is a diagram illustrating a feature of a shower head of FIG. 7.

FIG. 7 is a side cross-sectional view illustrating a gas supply assembly 302 for a substrate processing apparatus according to an embodiment, FIG. 8 is a diagram illustrating a feature of a gas distribution plate of FIG. 7, and FIG. 9 is a diagram illustrating a feature of a shower head of FIG. 7.

Elements of the gas supply assembly 302 and features of the elements are substantially the same as or similar to the descriptions given above with reference to FIGS. 2 to 4. Therefore, for convenience of description, a difference with the gas supply assembly 300 (see FIG. 2) described above will be mainly described below.

Referring to FIGS. 7 to 9, the gas supply assembly 302 may include a gas introduction part 310, a gas distribution plate 320_2, and a shower head 330_2.

The gas distribution plate 320_2 may include a plurality of through holes 322, which are disposed under the gas introduction part 310 and are connected to the plurality of second holes 312A.

The gas distribution plate 320_2 may include a first side surface R1, which configures a coplanar surface along with a side surface of the second body part 312, and a second side surface R2, which configures a coplanar surface along with a side surface of the shower head 330_2, and moreover, may have a step height between the first side surface R1 and the second side surface R2.

The gas supply assembly 302 may be fixed to an upper portion of a process chamber 100 (see of FIG. 1) through the step height of the gas distribution plate 320_2 and a step height between the second body part 312 and the first body part 311.

The gas introduction part 310 and the gas distribution plate 320_2 may be detachably coupled to each other by using, for example, a screw fastening manner using a fastening bolt. That is, the gas distribution plate 320_2 may include a plurality of fastening holes 325, which are processed in a screw shape, in order for the gas distribution plate 320_2 to be fastened to the gas introduction part 310.

As described above, the gas supply assembly 302 may include the gas introduction part 310 and the gas distribution plate 320_2, which are detachable/attachable therebetween, and thus, even when a problem caused by thermal fatigue occurs in a certain region due to being exposed to high-temperature plasma P (see FIG. 1), the problem may be more easily solved by replacing only a corresponding portion. Therefore, maintenance may be easy, and it is not required to entirely replace the gas supply assembly 302, thereby reducing cost.

The shower head 330_2 may be disposed under the gas distribution plate 320_2. The shower head 330_2 may be directly exposed to plasma P (see FIG. 1) generated in an internal space 110 (see FIG. 1) of a process chamber 100 (see FIG. 1).

The shower head 330_2 may be a part directly exposed to the high-temperature plasma P (see FIG. 1) among the elements of the gas supply assembly 301, and thus, may include a material having heat resistance.

The shower head 330_2 may include a plurality of distribution holes 332 connected to the plurality of through holes 322. The shower head 330_2 may correspond to a consumption part unlike the other elements of the gas supply assembly 302. Therefore, the shower head 330_2 may be easily replaced. The shower head 330_2 may be detachably fastened to, for example, the gas distribution plate 320_2 by a fastening bolt.

The gas distribution plate 320_2 will be described below in more detail.

The gas distribution plate 320_2 may include a plurality of through holes 322. The gas distribution plate 320_2 may include a top 320T_2 connected to the gas introduction part 310 and a bottom 320B_2 facing the shower head 330_2. Each of the plurality of through holes 322 may include an upper portion 322A connecting or in fluid communication with the top 320T_2 and a lower portion 322B connecting or in fluid communication with the bottom 320B_2. In some embodiments, each of the plurality of through holes 322 may further include a connection portion 322C connecting or in fluid communication with the upper portion 322A to the lower portion 322B. The plurality of through holes 322 may be provided to pass through the gas distribution plate 320_2 and may enable a process gas to easily move to the shower head 330_2.

In some embodiments, the lower portion 322B may be provided in a circular plate shape having a small thickness, for reducing or preventing undesired discharging from occurring in the plurality of through holes 322. That is, the lower portion 322B may have a shape where a diameter is constant from a region (i.e., an upper portion) contacting the connection portion 322C to a region (i.e., a lower portion) contacting the bottom 320B_2. For example, a diameter 322B_R of the lower portion 322B may be about 4 mm to about 5 mm. Also, a thickness 322B_H of the lower portion 322B may be about 0.05 mm to about 0.2 mm. However, the present embodiment is not limited thereto.

In some embodiments, a diameter of the connection portion 322C may be less than that of each of the upper portion 322A and the lower portion 322B. Also, a diameter of the lower portion 322B may be greater than that of each of the upper portion 322A and the connection portion 322C. That is, each of the plurality of through holes 322 may be designed so that the upper portion 322A, the connection portion 322C, and the lower portion 322B have different diameters, and thus, a flow velocity of the process gas varies. However, the present embodiment is not limited thereto.

The shower head 330_2 will be described below in more detail.

The shower head 330_2 may include a plurality of distribution holes 332. Also, the shower head 330_2 may include a plurality of fastening holes 335, which are processed in a screw shape, in order for the shower head 330_2 to be fastened to the gas distribution plate 320_2.

The shower head 330_2 may include a first surface 330T_2 connected to the gas distribution plate 320_2 and a second surface 330B_2 opposite to the first surface 330T_2. Each of the plurality of distribution holes 332 may include a first portion 332A, which connects or is in fluid communication with the first surface 330T_2 and has a first diameter 332A_R, and a second portion 332B, which connects or is in fluid communication with the second surface 330B_2 and has a second diameter 332B_R. The plurality of distribution holes 332 may be provided to pass through the shower head 330_2 and may enable the process gas to easily move to the shower head 330_2.

In some embodiments, the first diameter 332A_R of the first portion 332A may be less than the second diameter 332B_R of the second portion 332B. For example, the first diameter 332A_R of the first portion 332A may be about 0.5 mm or less. Also, the second diameter 332B_R of the second portion 332B may be about 0.7 mm to about 1.8 mm. However, the present embodiment is not limited thereto. That is, each of the plurality of distribution holes 332 may be designed so that the first portion 332A and the second portion 332B have different diameters, and thus, a flow velocity of the process gas varies. However, the present embodiment is not limited thereto.

In some embodiments, the first portion 332A may be vertical to the first surface 330T_2, and each of the plurality of distribution holes 332 have a refractive portion 332S, which is bent at a certain angle at a position at which the first portion 332A changes to the second portion 332B. Also, an inclination angle "θ" between the second portion 332B and the second surface 330B_2 may be an acute angle. The refractive portion 332S may be provided closer to the first surface 330T_2 than the second surface 330B_2. In other words, a length 332A_H of the first portion 332A may be less than a vertical-direction length 332B_H of the second portion 332B.

In the gas supply assembly 302 according to an embodiment, one through hole 322 may be connected or in fluid communication with at least two distribution holes 332. In some embodiments, one through hole 322 may be connected or in fluid communication with three distribution holes 332. Here, a virtual line connecting centers of the three distribution holes 332 connected to the one through hole 321 may be a regular triangle 332TA. In other words, the three distribution holes 332 may be respectively disposed at vertexes of the regular triangle 332TA. Also, a diameter 332CC_R of a virtual circle 332CC connecting the centers of the three distribution holes 332 may be less than a maximum diameter 322B_R of a lower portion 322B of the one through hole 322. The virtual circle 332CC may be a circumcircle of the regular triangle 332TA.

The diameter 332CC_R of the virtual circle 332CC may be, for example, about 2.5 mm to about 3.5 mm. Also, the maximum diameter 322B_R of the lower portion 322B may be about 4 mm to about 5 mm. That is, first portions 332A of three distribution holes 332 may be designed to all overlap one through hole 322. In some embodiments, at least some of second portions 332A of three distribution holes 332 may be designed not to overlap one through hole 321. However, the present embodiment is not limited thereto.

As described above, the shower head 330_2 may correspond to a consumption part unlike the other elements of the gas supply assembly 302. In a substrate processing apparatus 10 (see FIG. 1), when a plasma etch process is performed a plurality of times, an undesired etch process may be performed on the plurality of distribution holes 332, and thus, a flow velocity of the process gas passing through the shower head 330_2 may vary. The variation of the flow velocity of the process gas may affect a precise etch process, and thus, when a certain-level variation of the flow velocity is sensed, the shower head 330_2 should be replaced.

In the substrate processing apparatus 10 (see FIG. 1) according to an embodiment, designs of the shower head 330_2 and the gas distribution plate 320_2 each included in the gas supply assembly 302 may each be changed to the above-described shape, and thus, a replacement period of the shower head 330_2 may increase.

Also, some of the ions of the plasma P (see FIG. 1) may reversely flow with respect to a flow of the process gas and may penetrate into the gas distribution plate 320, along the plurality of distribution holes 332 of the shower head 330_2. In this case, the ions and the process gas each remaining in the plurality of through holes 322 of the gas distribution plate 320_2 may meet, and due to this, undesired discharging may occur between the gas distribution plate 320_2 and the shower head 330_2.

The substrate processing apparatus 10 (see FIG. 1) according to an embodiment may be designed so that the shower head 330_2 includes the plurality of distribution holes 332 bent at a certain angle in order for an ion having linearity not to penetrate into the gas distribution plate 320 and the gas distribution plate 320_2 includes the plurality of through holes 322 each including the lower portion 322B having a circular plate shape having a small thickness in order for the ion not to meet the process gas in the gas distribution plate 320_2, thereby effectively reducing or preventing undesired discharging.

Therefore, a productivity of the substrate processing apparatus 10 (see FIG. 1) may increase.

Figure 10:
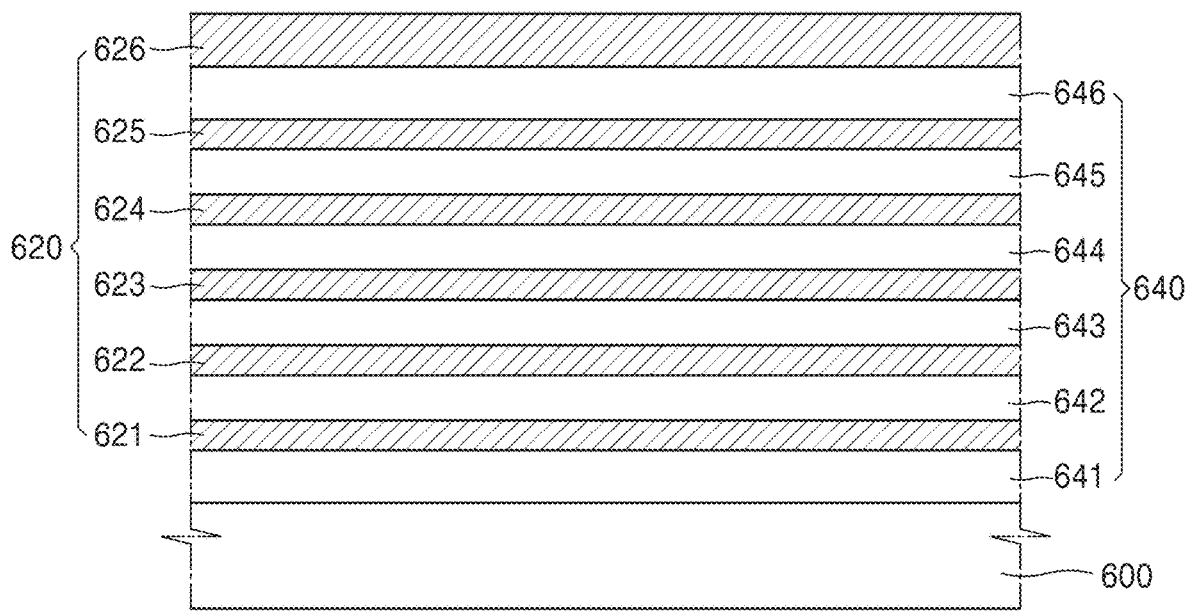
FIGS. 10 and 11 are diagrams illustrating a process of manufacturing a semiconductor device by using a substrate processing apparatus according to an embodiment.
Figure 10:
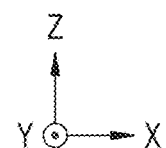
Figure 11:
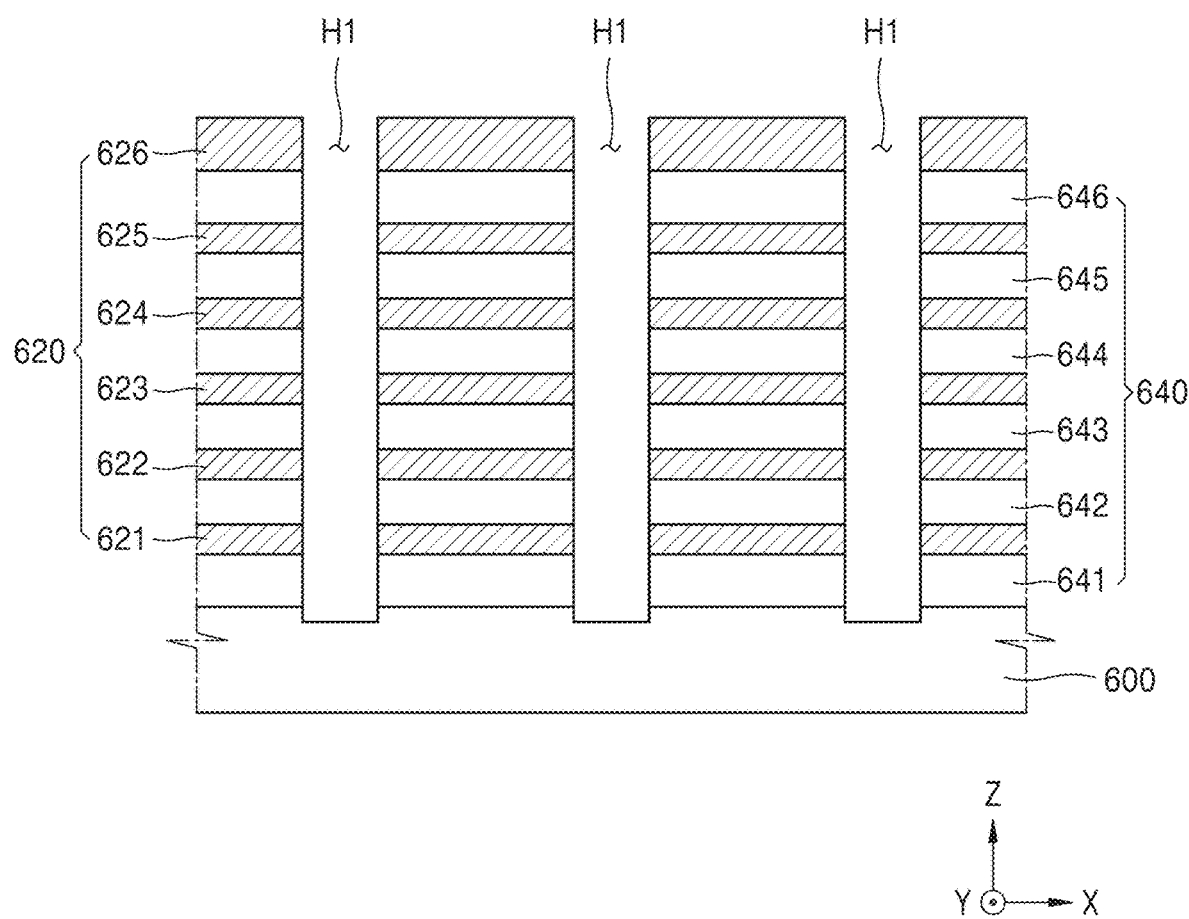

FIGS. 10 and 11 are diagrams illustrating a process of manufacturing a semiconductor device by using a substrate processing apparatus according to an embodiment.

Referring to FIG. 10, a plurality of interlayer insulation layers 620 and a plurality of sacrificial layers 640 may be alternately stacked on a semiconductor substrate 600.

The semiconductor substrate 600 may include, for example, silicon (Si). Alternatively, the semiconductor substrate 600 may include a semiconductor element such as germanium (Ge) or a compound semiconductor such as silicon carbide (SiC), gallium arsenide (GaAs), indium arsenide (InAs), and indium phosphide (InP). Alternatively, the semiconductor substrate 600 may have a silicon on insulator (SOI) structure. For example, the semiconductor substrate 600 may include a buried oxide layer (BOX) layer. Also, the semiconductor substrate 600 may include a conductive region, and for example, may include an impurity-doped well or an impurity-doped structure. Also, the semiconductor substrate 600 may have various isolation structures such as a shallow trench isolation (STI) structure.

Also, the semiconductor substrate 600 may have a thickness of about 0.1 mm to about 1 mm. When a thickness of the semiconductor substrate 600 is very thin, mechanical strength may be weak, and when a thickness of the semiconductor substrate 600 is very thick, a time taken in grinding later may increase, causing a reduction in productivity of semiconductor products.

In some embodiments, a lower structure (not shown) including at least one transistor may be disposed between the semiconductor substrate 600 and a lowermost sacrificial layer 641.

The interlayer insulation layers 620 may include a plurality of interlay insulation layers 621 to 626, and the sacrificial layers 640 may include a plurality of sacrificial layers 641 to 646. Also, as illustrated, the plurality of interlay insulation layers 621 to 626 and the plurality of sacrificial layers 641 to 646 may be alternately stacked on the semiconductor substrate 600 with respect to the lowermost sacrificial layer 641.

The sacrificial layers 640 may each include a material which is etched based on an etch selectivity with respect to the interlayer insulation layers 620. That is, in a process of etching the sacrificial layers 640 by using a certain etch recipe, the sacrificial layers 640 may include a material which is etched while reducing or minimizing etching of the interlayer insulation layers 620. The etch selectivity may be quantitatively expressed based on a ratio of an etch velocity of the sacrificial layers 640 to an etch velocity of the interlayer insulation layers 620.

In some embodiments, the sacrificial layers 640 may include one of materials having an etch selectivity of about 1:10 to about 1:200 with respect to the interlayer insulation layers 620. For example, the interlayer insulation layers 620 may include one material selected from among silicon oxide and silicon nitride, and the sacrificial layers 640 may include one material which is selected from among silicon, silicon oxide, silicon carbide, and silicon nitride and differs from a material of each of the interlayer insulation layers 620.

In some embodiments, the first sacrificial layer 641 and the sixth sacrificial layer 646 may be provided to be thicker than the second to fifth sacrificial layers 642 to 645. Also, the first interlayer insulation layer 621 and the fifth interlayer insulation layer 625 may be provided to be thicker than the second to fourth interlayer insulation layers 622 to 624. However, the present embodiment is not limited thereto. In other embodiments, a thickness of each of the interlayer insulation layers 620 and the sacrificial layers 640 may be variously modified, and the number of layers configuring each of the interlayer insulation layers 620 and the sacrificial layers 640 may be variously modified.

Referring to FIG. 11, a plurality of opening portions H1 passing through the interlayer insulation layers 620 and the sacrificial layers 640, which are alternately stacked, may be formed by using a substrate processing apparatus 10 (see FIG. 1) according to an embodiment.

The plurality of opening portions H1 may limit a space where a semiconductor region is to be formed in a semiconductor device. The plurality of opening portions H1 may each be a trench which has a depth in a Z direction and extends in a Y direction. Also, the plurality of opening portions H1 may be apart from one another by a certain distance in an X direction and may be alternately formed.

A process of forming the plurality of opening portions H1 may include a process of forming a mask pattern, defining positions of the plurality of opening portions H1, on the interlayer insulation layers 620 and the sacrificial layers 640, which are alternately stacked, and a process of alternately anisotropic-wet-etching the interlayer insulation layers 620 and the sacrificial layers 640 by using the mask pattern as an etch mask.

The substrate processing apparatus 10 (see FIG. 1) according to an embodiment may etch the interlayer insulation layers 620 and the sacrificial layers 640 on the semiconductor substrate 600 through an anisotropic-wet-etching process using plasma P (see FIG. 1).

In some embodiments, in a case where the interlayer insulation layers 620 and the sacrificial layers 640 are directly formed on the semiconductor substrate 600, as illustrated, the plurality of opening portions H1 may be formed to expose a portion of a top of the semiconductor substrate 600. In addition, as a result of over-etching in the anisotropic-wet-etching process, as illustrated, the semiconductor substrate 600 may be recessed by a certain depth under the plurality of opening portions H1.

In the substrate processing apparatus 10 (see FIG. 1) according to an embodiment, designs of a shower head 330 (see FIG. 1) and a gas distribution plate 320 (see FIG. 1) each included in a gas supply assembly 300 (see FIG. 1) may each be changed, and thus, a replacement period of the shower head 330 (see FIG. 1) may increase and a discharging risk may decrease in the gas distribution plate 320 (see FIG. 1). Therefore, the substrate processing apparatus 10 (see FIG. 1) may increase the manufacturing productivity of a semiconductor device manufactured through a substrate processing process (for example, an etch process) such as a process of forming the plurality of opening portions H1.

While the inventive concepts have been particularly shown and described with reference to embodiments thereof, it will be understood that various changes in form and details may be made therein without departing from the spirit and scope of the following claims.

What is claimed is:

1. A gas supply assembly for a substrate processing apparatus, the gas supply assembly comprising:
    a gas introduction part;
    a gas distribution plate connected to the gas introduction part, the gas distribution plate defining a plurality of through holes; and
    a shower head disposed under the gas distribution plate and detachably coupled to the gas distribution plate, the shower head defining a plurality of distribution holes in fluid communication with the plurality of through holes,
    wherein one through hole is in fluid communication with at least two distribution holes,
    each of the plurality of distribution holes has a first diameter and a second diameter differing from each other in the shower head,
    the shower head comprises a first surface facing the gas distribution plate and a second surface opposite to the first surface,
    each of the plurality of distribution holes comprises a first portion and a second portion, the first portion has an opening on the first surface and has the first diameter, and the second portion is in fluid communication with the second surface and has the second diameter, and
    the second diameter is greater than the first diameter.

2. The gas supply assembly of claim 1, wherein
    each of the plurality of distribution holes is vertical to the first surface and the second surface and comprises a stepped portion at a position at which the first portion changes to the second portion.

3. The gas supply assembly of claim 2, wherein
    the stepped portion is provided closer to the first surface than the second surface.

4. The gas supply assembly of claim 1, wherein, in each of the plurality of distribution holes,
    the first portion is vertical to the first surface,
    each of the plurality of distribution holes comprises a refractive portion bent at a position at which the first portion changes to the second portion, and
    an inclination angle between the second portion and the second surface is an acute angle.

5. The gas supply assembly of claim 4, wherein
    the refractive portion is provided closer to the first surface than the second surface.

6. The gas supply assembly of claim 1, wherein
    the gas distribution plate comprises a top connected to the gas introduction part and a bottom facing the shower head,
    each of the plurality of through holes comprises an upper portion in fluid communication with the top and a lower portion in fluid communication with the bottom, and
    the lower portion has a circular plate shape.

7. The gas supply assembly of claim 6, wherein
    one through hole is in fluid communication with three distribution holes, and
    a diameter of a virtual circle connecting the three distribution holes is less than a diameter of the circular plate shape.

8. The gas supply assembly of claim 7, wherein each of the three distribution holes comprises:
    a first portion in fluid communication with the one through hole and having the first diameter;
    a second portion in fluid communication with the first portion and having the second diameter; and
    a refractive portion bent at a position at which the first portion changes to the second portion.

9. The gas supply assembly of claim 1, wherein
    the gas distribution plate comprises a metal material, and
    the shower head comprises a ceramic material.

10. A gas supply assembly for a substrate processing apparatus, the gas supply assembly comprising:
    a gas introduction part;
    a gas distribution plate connected to the gas introduction part, the gas distribution plate comprising a metal material and defining a plurality of through holes; and
    a shower head disposed under the gas distribution plate and detachably coupled to the gas distribution plate, the shower head comprising a ceramic material and defining a plurality of distribution holes in fluid communication with the plurality of through holes,
    wherein one through hole is in fluid communication with three distribution holes and a virtual line connecting centers of the three distribution holes is a regular triangle,
    each of the plurality of distribution holes comprises a refractive portion bent inside the shower head and a diameter thereof varies with respect to the refractive portion,
    the shower head comprises a first surface facing the gas distribution plate and a second surface opposite to the first surface,
    each of the plurality of distribution holes comprises a first portion in fluid communication with the first surface to the refractive portion and a second portion providing fluid communication between the refractive portion and the second surface,
    the first portion is vertical to the first surface,
    an inclination angle between the second portion and the second surface is an acute angle, and
    the refractive portion is provided closer to the first surface than the second surface.

11. The gas supply assembly of claim 10, wherein
a diameter of the first portion is 0.5 mm or less, and
a diameter of the second portion is 0.7 mm to 1.8 mm.

12. The gas supply assembly of claim 10, wherein
the gas distribution plate comprises a top connected to the gas introduction part and a bottom facing the shower head,
each of the plurality of through holes comprises an upper portion and a lower portion, the upper portion in fluid communication with the top and the lower portion in fluid communication with the bottom, and
the lower portion has a circular plate shape.

13. The gas supply assembly of claim 12, wherein
a diameter of a circumcircle of the regular triangle is 2.5 mm to 3.5 mm,
a diameter of the circular plate shape is 4 mm to 5 mm, and
a thickness of the circular plate shape is 0.05 mm to 0.2 mm.

14. A substrate processing apparatus comprising:
a process chamber;
a gas supply configured to supply a process gas to the process chamber;
a substrate support disposed in the process chamber to support a substrate; and
a gas supply assembly disposed in the process chamber to distribute the process gas to an inner portion of the process chamber,
wherein the gas supply assembly includes:
a gas introduction part connected to the gas supply;
a gas distribution plate connected to the gas introduction part, the gas distribution plate defining a plurality of through holes; and
a shower head disposed under the gas distribution plate and detachably coupled to the gas distribution plate, the shower head defining a plurality of distribution holes in fluid communication with the plurality of through holes,
one through hole is in fluid communication with at least two distribution holes, and
each of the plurality of distribution holes has a first diameter and a second diameter differing from each other in the shower head, wherein
the shower head comprises a first surface facing the gas distribution plate and a second surface opposite to the first surface,
each of the plurality of distribution holes comprises a first cylinder and a second cylinder, the first cylinder is in fluid communication with the first surface and has the first diameter, and the second cylinder is in fluid communication with the second surface and has the second diameter, and
the second diameter is greater than the first diameter.

15. The substrate processing apparatus of claim 14, wherein
the first diameter is 0.5 mm or less, and
the second diameter is 0.7 mm to 1.8 mm.

16. The substrate processing apparatus of claim 14, wherein
each of the plurality of distribution holes is vertical to the first surface and the second surface, and
a height of the second cylinder is greater than a height of the first cylinder.

17. The substrate processing apparatus of claim 14, wherein
the shower head comprises a first surface facing the gas distribution plate and a second surface opposite to the first surface,
each of the plurality of distribution holes comprises a first portion and a second portion, the first portion is in fluid communication with the first surface and has the first diameter, and the second portion is in fluid communication with the second surface and has the second diameter,
the first portion is vertical to the first surface,
each of the plurality of distribution holes comprises a refractive portion bent at a position at which the first portion changes to the second portion, and
an inclination angle between the second portion and the second surface is an acute angle.

* * * * *